United States Patent [19]
Champlin

[11] Patent Number: 4,816,768
[45] Date of Patent: Mar. 28, 1989

[54] ELECTRONIC BATTERY TESTING DEVICE

[76] Inventor: Keith S. Champlin, 5437 Elliott Avenue S., Minneapolis, Minn. 55417

[21] Appl. No.: 169,858

[22] Filed: Mar. 18, 1988

[51] Int. Cl.$^4$ .............................................. G01N 27/46
[52] U.S. Cl. ...................... 324/428; 320/48; 324/430; 324/431; 324/436; 340/636
[58] Field of Search ............... 324/426, 427, 428, 436, 324/434, 431, 432, 430, 429; 340/636; 320/48

[56] References Cited
U.S. PATENT DOCUMENTS

| | | | |
|---|---|---|---|
| 3,873,911 | 3/1975 | Champlin | 324/436 X |
| 3,906,329 | 4/1975 | Baden | 324/428 X |
| 3,909,708 | 4/1975 | Champlin | 324/431 |
| 4,679,000 | 7/1987 | Clark | 324/428 |

Primary Examiner—Reinhard J. Eisenzopf
Assistant Examiner—Robert W. Mueller
Attorney, Agent, or Firm—Dorsey & Whitney

[57] ABSTRACT

An improved self-contained electronic device for testing storage batteries and other dc sources is disclosed. The testing device accurately performs small-signal measurements of the battery's dynamic conductance and provides for displaying either a numerical reading proportional to the battery's available power, or a qualitative assessment of the battery's condition. Special design features permit powering all active circuit elements by means of common power terminals and allow circuit implementation with medium scale integrated (MSI) circuits.

40 Claims, 6 Drawing Sheets

ELECTRONIC BATTERY TESTING DEVICE

TECHNICAL FIELD

This invention relates to an electronic measuring device for assessing the ability of a stoage battery or other dc source of electricity to deliver power to a load. More specifically, it relates to improved apparatus of the type disclosed in U.S. Pat. No. 3,873,911, ELECTRONIC BATTERY TESTING DEVICE, issued to Keith S. Champlin, Mar. 25, 1975, and of the type disclosed in U.S. Pat. No. 3,909,708, ELECTRONIC BATTERY TESTING DEVICE, issued to Keith S. Champlin, Sept. 30, 1975.

BACKGROUND ART

Storage batteries are employed in many applications requiring electrical energy to be retained for later use. Most commonly, they are employed in motor vehicles utilizing internal combustion engines. In such applications, energy stored by "charging" the battery during engine operation is later used to power lights, radio, and other electrical apparatus when the engine is stopped. The most severe demand upon the battery of a motor vehicle is generally made by the self-starter motor. Typically, several kilowatts of power are required by the self-starter motor to crank the engine. Failure to satisfactorily accomplish this task, particularly in cold weather, is usually the first indication of battery deterioration or trouble with the charging system. Clearly, a simple measurement that accurately assesses a battery's ability to supply power is of considerable value.

Prior to the publication of U.S. Pat. Nos. 3,873,911 and 3,909,708, a battery's ability to supply power was customarily assessed by means of a load test. A load test subjects a battery to a heavy dc load current having a predetermined value dictated by the battery's rating and temperature. After a prescribed time interval, the battery's terminal voltage under load is observed. The battery is then considered to have "passed" or "failed" the load test according to whether this terminal voltage is greater than, or less than, a particular prescribed value. Although the load test has been widely used for many years to field-test storage batteries, it possesses several serious disadvantages. These include:

1. Currents drawn are very large and therefore require apparatus that is heavy and cumbersome.
2. Because of these large currents, considerable "sparking" can occur at the battery terminals if the test apparatus is connected or disconnected under load conditions. Such "sparking" in the presence of battery gasses can cause an explosion with potentially serious injury to the operator.
3. A load test leaves the battery in a significantly reduced state of charge and therefore les capable of cranking the engine than before the test was performed.
4. Since the battery's terminal voltage drops continouously with time during the load test, the test results are imprecise and greatly dependent upon the skill of the operator.
5. Load test results are not repeatable since the test itself temporarily polarizes the battery. Such test-induced polarization significantly alters the initial conditions of any load tests performed subsequently.

A practical alternative to the common load test is taught in U.S. Pat. Nos. 3,873,911 and 3,909,708. Both of these patents disclose electronic apparatus for accurately assessing a battery's condition by means of small-signal ac measurements of its dynamic conductance. These two patents teach that a battery's dynamic conductance is directly proportional to its dynamic power; the maximum power that the battery can deliver to a load. Dynamic conductance is therefore a direct measure of a battery's electrical condition. Virtually millions of battery measurements performed over the course of thirteen years have fully corroborated these teachings and have proven the validity of this alternative testing method.

In comparison with the load test method of battery appraisal, the dynamic conductance testing method taught in U.S. Pat. Nos. 3,873,911 and 3,909,708 has many advantages. For example, dynamic conductance testing utilizes electronic apparatus that is small and lightweight, draws very little current, produces virtually no "sparking" when connected or disconnected, does not appreciably discharge or polarize the battery, and yields very accurate,1 reproducible, test results.

Two electronic battery tester embodiments are disclosed in U.S. Pat. No. 3,873,911; each of which accurately determines a battery's dynamic conductance and provides the operator with a numerical reading that is directly proportional to this quantity. The first embodiment comprises a bridge circuit that is brought to balance by the operator to obtain the numerical reading. The preferred second embodiment provides the operator with a direct readout that may be displayed numerically on a digital or analog meter. The operating principles of the preferred, direct-reading, second embodiment of the invention taught in U.S. Pat. No. 3,873,911 are based upon the theory of high-gain feedback amplifiers.

U.S. Pat. No. 3,909,708 likewise discloses two electronic battery tester embodiments. However, from the operator's point of view, their operation more closely resembles the operation of a traditional load-test apparatus than does operation of either of the numerical-reading embodiments disclosed in U.S. Pat. No. 3,873,911. Rather than obtaining a numerical measurement, the operator makes preliminary adjustments to knobs on the panel of the apparatus; setting them to the electrical rating and temperature of the battery undergoing test. The disclosed apparatus then employes small-signal measurements of dynamic conductance to simply ascertain whether or not the battery is capable of delivering an amount of power appropriate to the battery's rating and temperature. Accordingly, the two embodiments disclosed in U.S. Pat. No. 3,909,708 provide simple "pass-fail" battery condition information, just as does conventional load test apparatus. However, they accomplish this result without drawing a large current from the battery and are therefore not subject to the serious disadvantages of a load test. Just as with the second embodiment disclosed in the earlier patent, the operating principles of the second, preferred, embodiment disclosed in U.S. Pat. No. 3,909,708 are based upon the theory of high-gain feedback amplifiers.

Both preferred embodiments of electronic battery testing devices, the second embodiment disclosed in U.S. Pat. No. 3,873,911 and the second embodiment disclosed in U.S. Pat. No. 3,909,708, are based upon feedback amplifier principles. The original implementations of these electronic battery testing devices both utilized contemporary solid state device technology. Such technology was, however, limited to only discrete devices such as bipolar transistors and diodes, and small-scale integrated (SSI) circuit version of single-element monolithic operational amplifiers.

Great advances have been made in solid-state integrated circuit (IC) technology during recent years. In particular, high preformance complementary metal-oxide-semiconductor (CMOS) and bipolar medium-scale integrated (MSI) circuits, such as dual and quad operational amplifiers, have become abundantly available at very low prices. Therefore, important advantages, of both technical and economic natures, solid-state device technology in the electronic battery testing art.

Unfortunately, a number of design considerations preclude the simple introduction of the newer IC technology into the feedback-amplifier type of electronic battery tester circuitry disclosed in U.S. Pat. Nos. 3,873,911 and 3,909,708. Foremost among these considerations are the various problems imposed by the fact that the commercially available CMOS and bipolar MSI ICs do not provide separate pin-outs for supplying power to the individual elements on the chip. However, the original discrete-element feedback amplifier designs relied heavily upon the availability of such separate power connections. In particular, the original designs required separate connections for supplying power to different active devices in order to implement "four-point probe" architecture and thereby eliminate the spurious resistance of the connecting leads and battery contacts from the measurements; in order to realize a precisely-leveled oscillator voltage and thereby obtain increased measurement accuracy; and in order to implement synchronous detection of the amplified oscillator signal and thereby supress measurement errors caused by aspurious pickup of hum and noise. Accordingly, major changes in the basic design of the electronic battery tester embodiments would be required before one could realize any of the potential technical and economic benefits associated with the newer, more efficient and more cost-effective, IC technology.

SUMMARY OF THE INVENTION

The improved electronic battery testing device in accordance with the present invention incorporates the functions of both of the two earlier-disclosed feedback-type electronic battery testing devices in a single embodiment. By virtue of novel design innovations disclosed herein below, the need for separate power connections to different active devices is eliminated, thus permitting the successful integration of CMOS and bipolar MSI ICs into a practical battery tester implementation. This results in the realization of a very simple electronic battery testing device that is relatively inexpensive to manufacture, but which provides a very high degree of measurement accuracy. Disclosed innovations, which circumvent the need for separate connections to supply power to different active elements, include:

1. A novel technique for injecting the oscillator signal into the feedback amplifier's input circuit. The disclosed injection technique permits utilizing a common power source for both the oscillator and the feedback amplifier. Nevertheless, it maintains sufficient isolation between the amplifier's input and output circuit to allow the spurious resistance of the battery leads and contacts to be effectively eliminated from the measurements by means of "four-point probe" architecture.

2. A novel, precisely-leveled, oscillator implementation employing an operational amplifier, a CMOS bilateral analog switch and a zener diode. This simple circuit utilizes an unregulated, common, power supply but provides an output signal of precisely maintained amplitude; thus permitting high measurement accuracy.

3. A novel synchronous detector implementation accuracy. CMOS bilateral analog switch along with an operational amplifier employed as an integrator. This simple circuit also obtains power through common connections which supply power to all other active devices. It is therefore powered continuously and thus differs fundamentally from the synchronous detector circuit disclosed earlier in U.S. Pat. No. 3,909,708 which requires that its power source be interrupted periodically at the oscillator frequency. Nevertheless, the new synchronous detector implementation provides accurate, linear detection of the amplified oscillator signal while effectively suppressing externally generated hum and noise that is uncorrelated with the signal generated by the battery tester's internal oscillator.

The improved electronic battery testing device hereof can be used for obtaining either a qualitative or a quantitative assessment of a wide variety of dc energy sources. In addition to automotive-type batteries, the invention can be used to test many other dc energy sources such as other types of lead-acid batteries as well as nickel-cadmium batteries; lithium batteries; solar batteries, fuel cells; thermo-electric generators; thermionic generators; and magneto hydro-dynamic generators. The invention hererof is widely applicable to testing such dc energy sources by virtue of its simplicity, its safety, its accuracy, its ease of operation, and its low cost.

DETAILED DESCRIPTION

Figure 1:
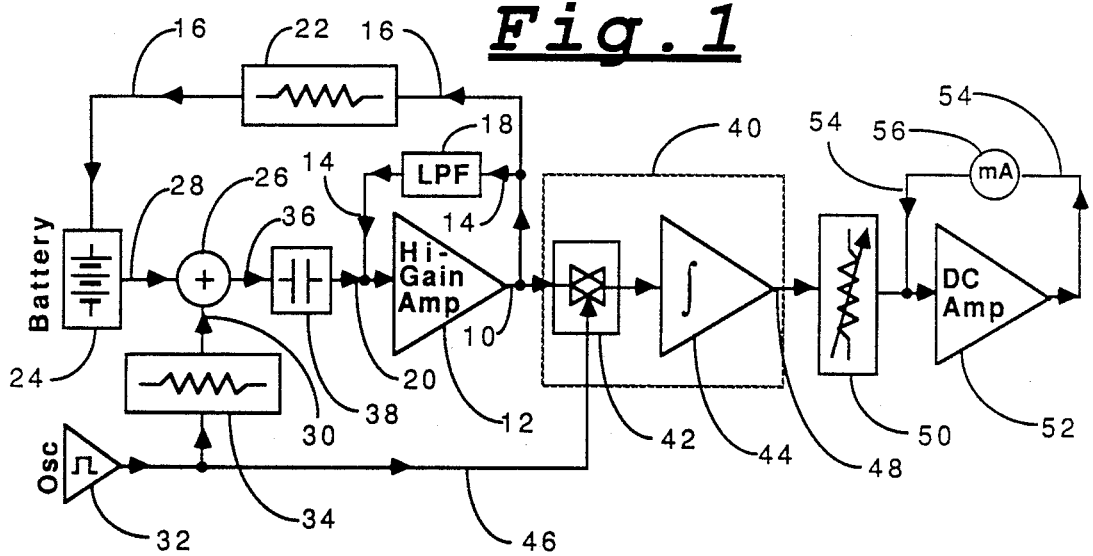
FIG. 1 is a simplified block diagram of an improved electronic battery testing device in accordance with the present invention

Referring first to FIG. 1, a simplified block diagram of an improved electronic battery testing device in accordance with the present invention is disclosed. Signals representative of the signal at output 10 of high-gain amplifier cascade 12 are fed back to input 20 of high-gain amplifier cascase 12 by means of two feedback paths; internal feedback path 14 and external feedback path 16. Internal feedback path 14 includes low pass filter (LPF) 18 and feeds a signal directly back to input 20 of high-gain amplifier cascade 12. The purpose of internal feedback path 14 and low pass filter 18 is to provide large dc feedback but very little ac feedback in order to fix the operating point of high-gain amplifier cascade 12 and insure its dc stability without appreciably reducing its ac voltage gain. External feedback path 16 contains resistive network 22 and feeds a signal back to the battery undergoing test 24. Summation circuitry 26 combines the resulting signal voltage 28 developed thereby acrosss battery 24 with a 100 Hz periodic square-wave signal voltage 30 provided by oscillator 32 through resistive attenuator network 34. The resulting composite signal 36 is capacitively coupled to input 20 of high-gain amplifier cascade 12 by means of capacitive coupling network 38.

As is fully explained below with reference to FIG. 2, the voltage at output 10 of high-gain amplifier cascade 12 comprises a constant dc bias component along with an ac signal component that is proportional to the dynamic conductance of the battery undergoing test 24. The constant dc bias component is ignored while the ac signal component is detected and accurately converted to a dc signal voltage by synchronous detector 40 comprising analog switch 42 and integrator 44. Synchronous detector 40 functions by periodically turning analog switch 42 on and off by means of a signal derived from oscillator 32 and communicated to the control input of analog switch 42 through synchronization signal path 46. The resulting periodically-switched signal is then smoothed by integrator 44. By virtue of the switching in synchronism with the signal generated by oscillator 32, the dc signal at output 48 of integrator 44 is porportional to the level of any ac signal component at output 10 of amplifier cascade 12 that is fully correclated with the signal generated by oscillaot 32. However, it is not effected by any spurious ac signal components, such as ac hum and noise, that are uncorrelated with the periodic signal generated by oscillator 32.

The smoothed dc signal at output 48 of integrator 44 is passed through adjustable resistive network 50 and applied to the input of dc-coupled operational amplifier 52. Feedback path 54 of operational amplifier 52 contains dc milliameter 56. Accordingly, the reading of dc milliameter 56 is proportional to the dc signal level at the output 48 of integrator 44, and hence to the dynamic conductance of battery 24; whlie the constant of proportionality is determined by the value of resistive network 50.

By utilizing an appropriate fixed resistance value in resistive network 50 and then calibrating millameter 56 in units proportional to the battery's dynamic conductance, the embodiment disclosed in FIG. 1 will emulate the direct reading battery tester disclosed in U.S. Pat. No. 3,873,911. In addition, as is shown below with reference to FIG. 9, the resistance value of resistive network 50 which brings the reading of dc milliameter 56 to a particular fixed value is directly proportional to the dynamic conductance of battery 24. U.S. Pat. No. 3,909,708 furthermore discloses that the dynamic conductance of a battery that is capable of delivering 100% of its rated power is essentially proportional to its rating in conventional battery rating units such as amperehours (AH) or cold-crank amperes (CCA). Hence, by linearly calibrating resistive network 50 in battery rating units, and then designating "pass" and "fail" regions on the face of milliameter 56, the embodiment disclosed in FIG. 1 will also emulate the "pass-fail" battery testing device disclosed in U.S. Pat. No. 3,909,708. Accordingly, by employing a switch to select either a fixed-valued resistive network 50 or an adjustable-valued network 50 that is linearly calibrated in battery rating units, and then providing both a linear scale and "pass-fail" regions on the face of milliameter 56, one can realize each of the functions of the two earlier-disclosed electronic battery testing embodiments with a single device.

Referring next to FIG. 1, a simplified schematic diagram of a section of the block diagram of FIG. 1 is disclosed. Operational amplifier A1 along with its dc biasing resistors R1, R2, and R3, and transistor Q1 connected as an emitter follower, comprise high-gain amplifier cascade 12 of FIG. 1. In addition, resistors R4 and R5 along with capacitor C3 comprise low pass filter 18; resistor R6 comprises resistive network 22; and capacitors C1 and C2 comprise capacitive coupling network 38. Battery 24 is represented in FIG. 2 by its equivalent circuit comprising a battery emf $V_B$ in series with an internal battery resistance $R_x$. The periodic square-wave signal presented to summation circuitry 26 by oscillator 32 at output 30 of resistive attenuator 34 is represented by voltage $V_{in}$ in FIG. 2. Summation circuitry 26 comprises the series interconnection of voltage $V_{in}$ and the voltage developed across battery 24 as sensed by the two connections C and D contacting battery 24.

Figure 2:
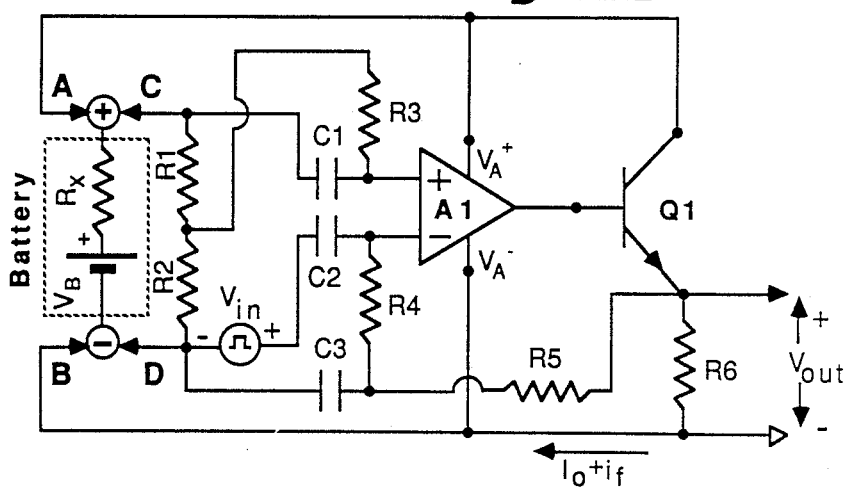
FIG. 2 is a simplified schematic diagram of a section of the block diagram of FIG. 1 disclosing "four-point probe" architecture for interconnecting the high-gain amplifier, the oscillator, and the battery undergoing test.

Still referring to FIG. 2, dc bias conditions will first be derived. The dc bias voltage at the noninverting (+) input of operational amplifier A1 is established by the voltage division between resistor R1 and R2. The input impedance of operational amplifier A1 can be assumed to be much larger than resistance R3. Under such circumstances, the dc voltage across R3 is negligible and the dc voltage at the noninverting input, measured with respect to the negative terminal of the battery, is equal to $$V_o = \frac{V_B R2}{(R1 + R2)} \quad (1)$$

Resistors R4 and R5 provide an internal dc feedback path from the emitter of Q1 to the inverting (−) input of A1. The resulting negative dc feedback along with the very high gain of the amplifier cascade causes the inverting (−) input of A1 to assume the same dc bias voltage as the noninverting (+) input. By again assuming the input impedance of operational amplifier A1 to be very large, one finds that virtually no voltage drop occurs across resistors R4 and R5. Accordingly, the emitter of Q1 assumes the same dc bias voltage as the inverting input of A1. The dc component of the output voltage is therefore $$V_{out}(dc) = V_o = \frac{V_B R2}{(R1 + R2)} \quad (2)$$

The dc bias analysis carried out above shows that transistor Q1 operates as a class-A emitter follower amplifier and has a dc bias current given by $$I_o = \frac{V_{out}(dc)}{R6} = \frac{V_B R2}{(R1 + R2)R6} \quad (3)$$

In addition to the dc bias component given by equation (2), the output voltage $V_{out}$ also contains an ac signal component. The low-pass filter comprised of C3, R4 and R5 effectively attenuates ac output signals and prevents them from passing through the internal dc feedback path. Accordingly, the ac component of the output signal will be essentially determined by the negative feedback provided by the external feedback circuit.

Referring again to FIG. 2, one sees that an ac current proportional to the ac signal component of $V_{out}$ is passed through the battery by means of an ac feedback-current loop comprising transistor Q1, resistor R6, battery resistance $R_x$, and conductors leading to battery contacts at A and B. This ac feedback current is equal to $$i_f = \frac{V_{out}(ac)}{R6} \quad (4)$$

The resulting ac signal voltage developed across the battery resistance $R_x$ is ($i_f R_x$). This ac voltage is sensed at battery contacts C and D and added in series to the ac signal voltage $V_{in}$ derived from the square-wave oscillator output. The composite ac signal voltage is then capacitively-coupled to the differential input of A1 by means of the two coupling capacitors C1 and C2.

The input voltage-sensing loop comprises battery resistance $R_x$ along with ac signal voltage $V_{in}$, capacitors C1 and C2.

The input voltage-sensing loop comprises battery resistance $R_x$ along with ac signal voltage $V_{in}$, capacitors C1 and C2, the differential input of operational amplifier A1, and conductors leading to battery contacts at C and D. One sees that the input voltage-sensing loop and the output feedback-current loop are separate from one another but are coupled together by virtue of their one shared element -- the battery resistance $R_x$.

In view of the ac negative feedback and the very large ac gain of the biased amplifier cascade, the total ac signal voltage applied to the differential input of operational amplifier A1 is essentially zero. Hence, the ac signal voltage developed across $R_x$ is very nearly equal in magnitude, but opposite in sign, to the applied ac signal voltage $V_{in}$. Accordingly, one can write $$i_f R_x = -V_{in} \quad (5)$$

Combining equations (4) and (5) and solving for $V_{out}(ac)$ leads to $$V_{out}(ac) = -\frac{R6 V_{in}}{R_x} = -(R6 V_{in})G_x \quad (6)$$

where $G_x = 1/R_x$ is the battery's dynamic conductance measured in Siemens.

One sees from the ac analysis carried out above that the magnitude of the ac signal component at the output of the circuit disclosed in FIG. 2 is directly proportional to the dynamic conductance, $G_x$, of the battery 24 undergoing test.

FIG. 2 discloses that the battery testing apparatus makes four separate connections to the battery 24 undergoing test. Two of these connections, at A and C, independently contact the positive (+) terminal of battery 24. The other two connections, at B and D, independently contact the negative (−) terminal. This special four-conductor contacting arrangement constitutes "four-point probe" architecture. Its purpose is to effectively isolate the output feedback-current loop from the input voltage-sensing loop except for the desired coupling provided by the one shared elements $R_x$. The "four-point probe" architecture described herein is a solution to the severe measurement problem that results from the face that the internal resistance of a typical automotive-type battery is extremely small (~0.005 ohms) compared with the spurious resistance of practical battery contacts and connecting wires—which often total several ohms. In practice, "four-point probe" connections implemented with special two-conductor spring clips of the type disclosed in U.S. Pat. No. 3,873,911.

As is disclosed above, the ac feedback current $i_f$ passes through the battery by means of the "four-point probe" contacts at A and B. Equation (4) discloses that the value of current $i_f$ is determined completely by the ratio of $V_{out}(ac)$ to R6. Accordingly, several ohms of additional supurious resistnace introduced into the feedback-current loop by the leads and contacts at A and B will not alter the relationship between $i_f$ and $V_{out}(ac)$ and will therefore not effect measurement accuracy. As is further disclosed above, the ac feedback voltage developed across the battery is independently sensed at "four-point probe" contacts C and D. Since the impedance of the amplifier's input circuit is of the order of many thousands of ohms, a few ohms of additional spurious resistance in the input voltage-sensing loop at contacts C and D will likewise have negligible effect on the measurements. If, however, contact were made to either battery terminal at a single contact point, any spurious contact resistance and lead wire resistance would be common to both the feed-back current loop and the voltage-sensing loop and would therefore add directly to the measured value of $R_x$.

One sees that the "four-point probe" architecture described above separates the spurious elements of the feedback-current loop from the voltag-sensing loop thus permitting accurate battery conductance measurements to be obtained even though the interconnecting leads and contacts may themselves have resistances that are hundreds of times larger than the battery's internal resistance $R_x$. However, in order for such "four-point probe" architecture to function effectively, a very high degree of circuit isolation must exist between the feedback-current loop and the voltage-sensing loop. Otherwise, spurious signal voltages developed across the spurious resistances in the feedback-current loop—voltages that are usually many times larger than the microvolt-size ac signal developed across $R_x$ —will be coupled into the voltage-sensing loop and degrade measurement accuracy.

For many battery testing applications, it is very advantageous to power the battery testing apparatus by the battery undergoing test rather than require it to have its own source of power. In the circuit disclosed in FIG. 2, operational amplifier A1 receives its operating power from the battery contact A, and power terminal $V_A-$, connected to battery contact B. Since "four-point probe" architecture places transistor Q1 in contact with the feedback-current loop, the A and B contacts are used to power A1 in FIG. 2. This choice is dictated by the inherent coupling that exists between A1 and Q1 along with the need for isolating the feedback-current loop from the voltage-sensing loop.

"Four-point probe" architecture places the oscillator signal $V_{in}$ in the voltage-sensing loop. For a practical transformerless oscillator circuit, the oscillator's output voltage is established with respect to one of its power supply terminals. Thus, the choice of battery contacts to be used for powering the oscillator will be strongly influenced by the need to provide adequate circuit isolation between the feedback-current loop and the voltage-sensing loop.

Figure 3:
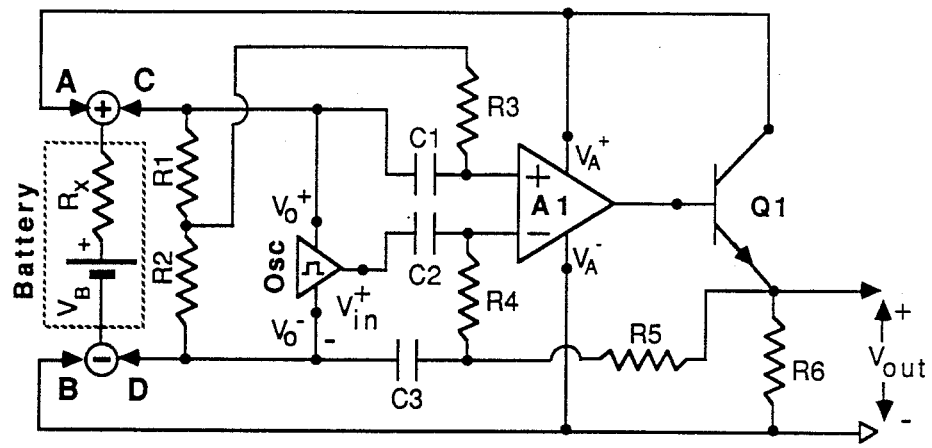
FIG. 3 is a simplified schematic diagram, similar to that disclosed in FIG. 2, but showing connections required for providing oscillator power in accordance with the teaching of U.S. Pat. Nos. 3,873,911 and 3,909,708.

Referring next to FIG. 3, a schematic diagram similar to FIG. 2 is disclosed including connections used for providing oscillator power according to the teachings found in U.S. Pat. Nos. 3,873,911 and 3,909,708. The ac signal $V_{in}$ is seen to be established between a single oscillator output terminal and the oscillator circuit's power supply terminal, $V_o-$. Thus, one of the oscillator's power supply terminals is also one of its output signal terminals and must therefore be in contact with the voltage-sensing loop. Accordingly, the avoid coupling the voltage-snesing loop to the feedback-current loop, the oscillator in FIG. 3 receives its power through the voltage-sensing contacts at C and D.

Powering the oscillator circuit by means of the voltage-sensing contacts has two disadvantages. First, because of the very large ac amplifier gain, signal levels in the voltage-sensing loop are very small. Consequently, excess noise generated by currents flowing through the voltage-sensing contacts, lead wires, and input circuitry introduces serious measurement problems. Second, practical MSI integrated circuits, such as dual and quad operational amplifiers, do not provide separate pin-outs for individual elements on the chip. Therefore, if the oscillator is to share MSI ICs with the amplifier and detector, it must be capable of being powered from the same pair of battery contacts as the other active devices.

Figure 4:
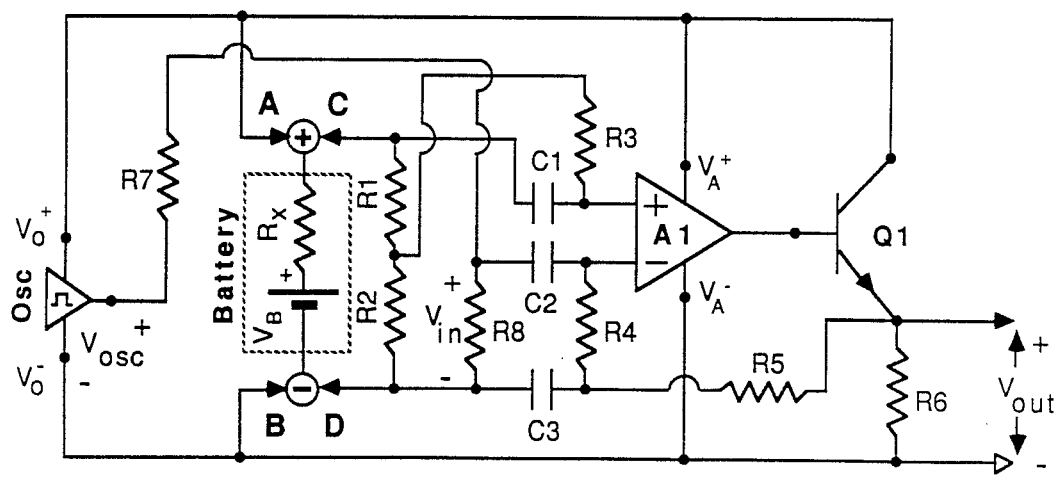
FIG. 4 is a simplified schematic diagram, similar to that disclosed in FIG. 2, but showing connections for providing oscillator power in accordance with the present invention.

Referring now to FIG. 4, a method is disclosed for injecting a signal into the voltage-sensing loop by an oscillator powereed from contacts in the feedback-current loop without introducing excessive loop coupling. The oscillator of FIG. 4 develops an ac voltage $V_{osc}$ between a single output terminal and its negative power supply terminal $V_o-$. The circuit is powered by connections from the oscillator's $V_o+$ and $V_o-$ power terminals to the A and B battery contacts, respectively. This places the oscillator's power terminals directly in parallel with the power terminals for the high-gain amplifier cascade, $V_A+$ and $V_A-$.

The oscillator injects a signal $V_{in}$ into the voltage sensing loop by means of injection resistor R7 and voltage-viewing resistor R8. The signal current passing through resistors R7 and R8 returns to the $V_o-$ terminal of the oscillator by passing through the D contact and connecting wire, through the negative battery terminal itself, and then through the B contact and connecting wire. Thus, the spurious resistances of the B and D contacts and connecting wires will tend to couple the two loops and may therefore degrade measurement accuracy. However, as will be shown more clearly below, if the oscillator voltage $V_{osc}$ is made sufficiently large, the two loops can be isolated to such a degree that the errors introduced by spurious resistances as large as several ohms will be negligible.

Figure 5:
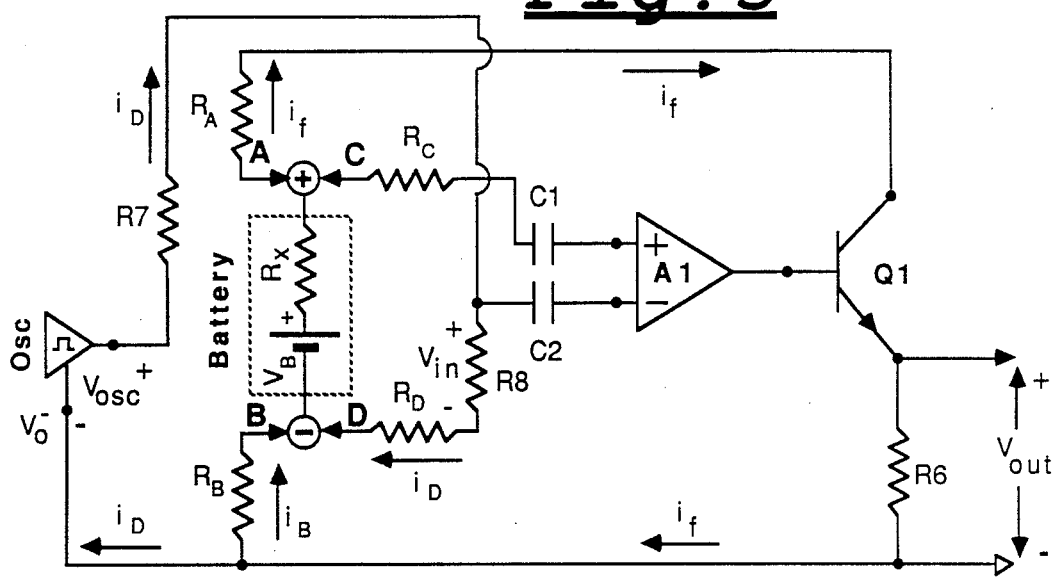
FIG. 5 is a simplified schematic diagram employed in analyzing measurement errors due to loop-coupling introduced by the signal injection circuit of FIG. 4.

Referring next to FIG. 5, a simplified schematic diagram is disclosed which will now be employed to analyze measurement errors resulting from loop-coupling introduced by the signal injection circuit of FIG. 4. The four resistances $R_A$, $R_B$, $R_C$, and $R_D$ in FIG. 5 represent the spurious resistances of the four lead-wires and contacts at A, B, C, and D, respectively. As seen in FIG. 5, the ac feedback current $i_f$ passing through resistor R6 splits into two currents, $i_B$ and $i_D$. Current $i_B$ passes through spurious resistance $R_B$ and enters the negative terminal of the battery at contact B. Current $i_D$ passes through the oscillator circuit, through resistors R7 and R8, through spurious resistance $R_D$, and enters the negative terminal of the battery at contact D. The two currents add together in the battery. Their sum, $i_f$, leaves the battery at contact A, passes through spurious resistance $R_A$, and returns to the collector of transistor Q1.

By using an appropriate splitting factor derived from the resistance of the two paths, one can show that the current $i_D$ is proportional to $i_f$ and given by $$i_D = i_f \left[ \frac{R_B}{R7 + R8 + R_B + R_D} \right], \quad (7)$$

The total signal voltage at the differential input of the operational amplifier is found by superposition of the voltage drops in the voltage-sensing loop due to the currents $i_f$ and $i_D$, and the voltage $V_{in}$ injected into the voltage-sensing loop by the oscillator. By virtue of the very large ac gain, this total input signal voltage is essentially zero. Thus, one can write $$i_f R_x + i_D(R8 + R_D) + V_{osc} \left[ \frac{R8 + R_D}{R7 + R8 + R_B + R_D} \right] = 0. \quad (8)$$

Eliminating $i_D$ from equations (7) and (8) and using equation (4) to express $i_f$ in terms of $V_{out}(ac)$ leads to $$\frac{V_{out}(ac)}{V_{osc}} = \frac{-R6(R8 + R_D)}{R_x(R7 + R8 + R_B + R_D) + R_B(R8 + R_D)}. \quad (9)$$

Equation (9) can be simplified by noting that resistors R7 and R8 are much larger than spurious resistances $R_B$ and $R_D$. Thus, one can assume that $$\left. \begin{array}{c} R7 >> R_B \\ R8 >> R_D \end{array} \right\} . \quad (10)$$

Accordingly, equation (9) can be written $$\frac{V_{out}(ac)}{V_{osc}} = \frac{-R6 R8}{R_x(R7 + R8) + R_B R8}. \quad (11)$$

Equation (11) is the desired result. It relates $V_{out}(ac)$ to $V_{osc}$ and includes the effects of both the battery's internal resistance, $R_x$, and the spurious lead-wire and contact resistance, $R_B$. Note that only one of the four spurious resistances will have a significant effect on the measurements. Under the assumption that $$R_x(R7+R8) >> R_B R8, \quad (12)$$

the second term in the denominator of equation (11), the error term, can be neglected in comparison with the first term. Under these circumstances, equation (11) becomes $$\frac{V_{out}(ac)}{V_{osc}} = -\left[\frac{R8}{R7+R8}\right]\left[\frac{R6}{R_x}\right] \quad (13)$$

which agrees with the earlier result given by equation (6) since $$V_{in} = \frac{R8}{R7+R8} V_{osc}, \quad (14)$$

Substituting equation (13) into inequality (12) yields the following sufficient condition for neglecting the error term in the denominator of equation (11):

$$\left|\frac{V_{osc}}{V_{out}(ac)}\right| R6 >> R_B. \quad (15)$$

In the practical electronic battery testing device disclosed herein below, the following approximate values apply:

$V_{osc} \approx 5$ volts $V_{out}(ac) \approx 1$ volt $R6 \approx 20$ ohms

Therefore, the magnitude of the left-hand side of inequality (15) can be approximated by $$\left|\frac{V_{osc}}{V_{out}(ac)}\right| R6 \approx 100. \quad (16)$$

The error term of equation (11) introduces only a one percent measurement error when the left-hand side of inequality (15) is 100 times larger than the right-hand side. Therefore, a spurious resistance $R_B$ of one ohm or less will introduce a measurement error that does not exceed one percent. Futhermore, the error analysis above shows that the measurements are uneffected by spurious resistances $R_A$ and $R_C$; and are also uneffected by $R_D$ as long as inequality (10) is satisfied. Thus, for the oscillator signal injection method disclosed in FIG. 4, only the spurious resistance $R_B$ causes any potential degradation of measurement accuracy. Moreover, as is clearly shown by the analysis above, even the deleterious effect of $R_B$ can be effectively nullified with this circuit by choosing $V_{osc}$ to be sufficiently large.

The oscillator circuit produces a square wave output signal at a frequency of approximately 100 Hz. Although the exact frequency of oscillation is not critical, equation (11) discloses taht $V_{out}(ac)$ is directly proportional to $V_{osc}$. Thus, for high accuracy, the magnitude of the oscillator signal must remain very constant under all conditions of voltage and temperature encountered in operation.

The second invention embodiment disclosed in U.S. Pat. No. 3,873,911 utilizes an oscillator circuit comprising a discrete operational amplifier connected as a conventional astable multivibrator. The problems with using this circuit, and still attaining the high measurement accuracy desired for the present invention, are twofold. First, the level of the oscillator's output signal is nearly proportional to its supply voltage. Thus, with oscillator power supplied by the battery being tested, the accuracy of conductance measurements is very dependent upon the "surface charge" conditions of the battery. Second, because of imperfections that are always present in the output circuits of IC operational amplifiers, the saturated maximum and minimum output voltage levels are inevitably offset from the power supply voltage levels, $V_o+$ and $V_o-$, by significant amounts that depend on temperature. As a consequence, the oscillator's output signal level changes with temperature, thus introducing a significant temperature-dependent measurement error.

The second invention embodiment disclosed in U.S. Pat. No. 3,909,708 utilizes a different type of oscillator circuit in an attempt to solve the problems described above. Instead of an operational amplifier, the circuit employes two discrete transistors functioning in a conventional astable transistor multivibrator. This tends to eliminate the problem of the temperature-dependent output signal level that is inherent to IC operational amplifier multivibrators. In addition, the voltage supplied to the multivibrators is regulated with a zener diode. This holds the oscillator's supply voltage, and hence its output voltage, constant and tends to reduce the dependence of the measurements on the battery's "surface charge".

Neither of the problem solutions employed in U.S. Pat. No. 3,909,708 can be employed with the present invention, however. The use of discrete transistors is, of course, the antithesis of utilizing MSI technology. Moreover, with MSI technology, it is not possible to separately regulate the power supplied to the oscillator since all active devices in the IC must receive power from the same source.

Figure 6:
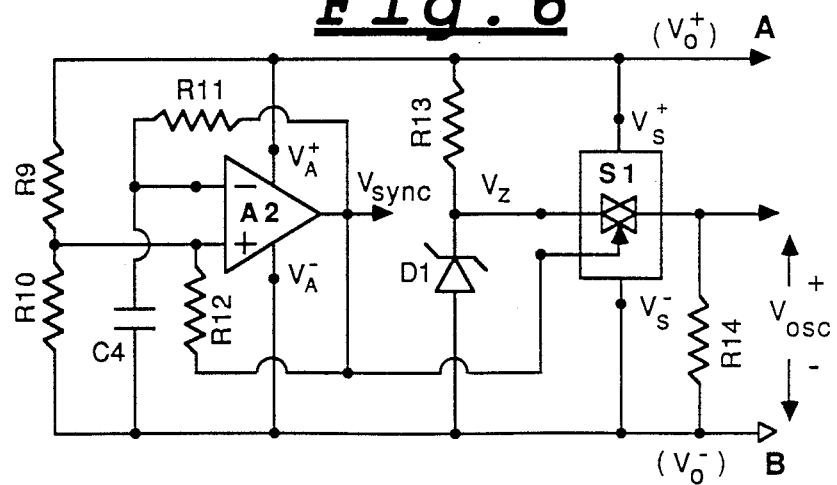
FIG. 6 is a schematic diagram of an oscillator circuit providing a precisely leveled output signal in accordance with the present invention.

Referring now to FIG. 6, a schematic diagram of an oscillator circuit for producing a precisely-leveled output signal in accordance with the present invention is disclosed. Operational amplifier A2 along with resistors R9, R10, R11, R12 and capacitor C4 comprise a conventional astable multivibrator circuit. Positive feedback is provided by resistor R12 along with voltage divider resistors R9 and R10. Negative feedback is provided by resistor R11 along with capacitor C4. As is well known to one of ordinary skill in the art, the output voltage of operational amplifier A2 alternately assumes a maximum value near its positive supply voltage, $V_A+$, and a minimum value near its negative supply voltage, $V_A-$. If R9 and R10 are equal, the output waveform of this oscillation is nearly symmetrical with an oscillation period, T, given by $$T = (2R11C4) \ln\left(1 + \frac{R9}{R12}\right) \quad (17)$$

The synchronizing output of the astable multivibrator, $V_{sync}$, is connected to the control input of a CMOS bilateral analog switch S1. One of the signal terminals of analog switch S1 is held at a constant voltage, $V_z$, by a zener diode D1 which is supplied power through series resistor R13. The other signal terminal of S1 is connected to one side of an output load resistor R14 whose other side is connected to the negative terminal of diode D1. The oscillator output signal, $V_{osc}$, is developed across the output load resistor R14.

The operational amplifier power terminals, $V_A+$ and $V_A-$, are connected in parallel with the analog switch power terminals, $V_S+$ and $V_S-$, and together comprise the oscillator power supply terminals, $V_o+$ and $V_o-$, of FIG. 4. These common power connections receive power from the battery undergoing test by means of feedback-current loop connections at battery contacts A and B, respectively. As is shown in FIG. 6, the negative side of the common-mode output signal voltage, $V_{osc}$, is in common with power terminal $V_o-$ and hence with battery contact B.

During the portion $T_1$ of time period T that the multivibrator output is at its highest level, $V_{sync}(hi)$, the analog switch S1 is turned "on". Assuming that the "on" resistance of S1 is much less that R14, the output voltage then assumes its highest value $$V_{osc}(hi) = V_z \quad (18)$$

During the portion $T_2$ of time period T that the multivibrator output is at its lowest level, $V_{sync}(lo)$, the analog switch S1 is turned "off". Assuming that the "off" resistance of S1 is much larger than R14, the output voltage is essentially pulled to zero by R14 so that $$V_{osc}(lo) = 0 \quad (19)$$

Accordingly, the oscillator output voltage signal, $V_{osc}$, oscillates between $V_z$ and zero and very closely approximates a perfectly-leveled square wave having a constant peak-to-peak amplitude, $V_z$.

One sees from equation (13) that the peak-to-peak amplitude of the ac signal component at the output of the high-gain amplifier cascade in FIG. 4 is therefore $$|V_{out}(ac)| = \left[\frac{R8}{R7 + R8}\right]\left[\frac{R6}{R_x}\right]V_z. \quad (20)$$

The zener diode voltage, $V_z$, is chosen to be 5.1 volts to take advantage of the very nearly zero temperature coefficient that is characteristic of zener diodes having this particular zener voltage. Accordingly, $|V_{out}(ac)|$ will be very nearly independent of both battery voltage and instrument temperature.

One sees that the simple precisely-leveled oscillator circuit disclosed in FIG. 6 has properties that are very nearly ideal for application in an electronic battery testing device. It can be powered from common power supply connections and delivers a precise output signal level that is virtually independent of both temperature and supply voltage. These special attributes of the simple circuit disclosed in FIG. 6 contribute to the very high measurement accuracy that is achieved with the invention hereof.

Figure 7:
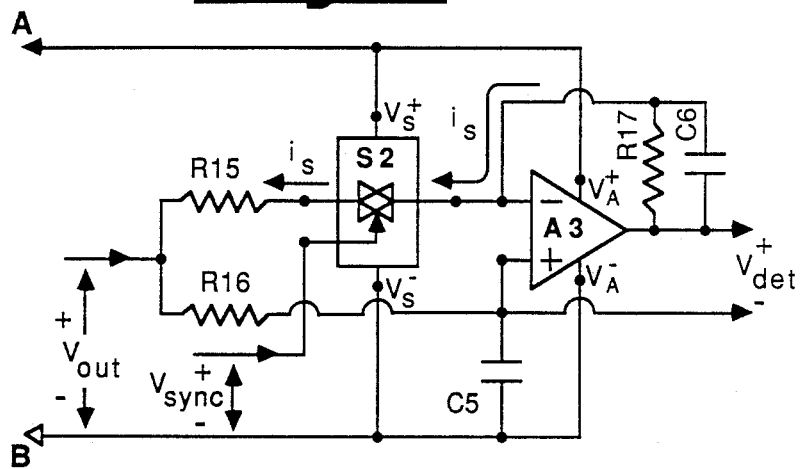
FIG. 7 is a schematic diagram of a continuously-powered synchronous detector circuit in accordance with the present invention.

Referring next to FIG. 7, a schematic diagram of a simple, yet very accurate, synchronous detector circuit in accordance with the present invention is disclosed. The purpose of this circuit is to provide a dc output signal, $V_{det}$, that is precisely proportional to the peak-to-peak amplitude of the ac signal component of the amplifier's output voltage, $|V_{out}(ac)|$, while totally ignoring the dc bias component, $V_{out}(dc)$. A particular feature of the circuit of FIG. 7 is that it is virtually unresponsive to spurious signal components, such as ac hum and noise, that are uncorrelated with the oscillator signal, $V_{osc}$. The synchronous detector circuit thus permits operation of the battery testing device in electrically "noisy" environments without requiring the extensive use of shielding—which would substantially increase manufacturing costs. As in the case of the oscillator circuit disclosed above, the synchronous detector circuit disclosed herein is capable of being powered from a common source delivering power continuously to other active elements in the circuit. It is therefore fully compatible with modern MSI IC technology.

The circuit of FIG. 7 discloses a CMOS bilateral analog switch S2 and operational amplifier A3 along with resistors R15, R16, R17, and capacitors C5 and C6. Operational amplifier A3 along with resistors R15, R17, and capacitor C6 comprise an integrator circuit. The noninverting (+) input of A3 is biased to the value of the dc component of $V_{out}$ by means of resistor R16 along with bypass capacitor C5. The signal applied to the inverting (−) input of A3 is derived from $V_{out}$ and passes through resistor R15 and analog switch S2. This signal is switched "on" and "off" at the oscillator frequency by virtue of the synchronization signal, $V_{sync}$, that is obtained from the circuit of FIG. 6 and applied to the control input of S2.

Just as in the case of the oscillator circuit disclosed FIG. 6, both the operational amplifier and the analog switch of the detector circuit of FIG. 7 are powered through common connections to the feedback-current loop battery contacts A and B. Both of the two input signals disclosed in the circuit of FIG. 7, $V_{out}$ and $V_{sync}$, are common-mode signals established with respect to the negative power supply lead contacting the batter at B.

Operation of the synchronous detector circuit of FIG. 7 will now be explained by means of reference to the timing and waveform diagrams of FIGS. 8a, 8b, 8c, and 8d.

Figure 8A:
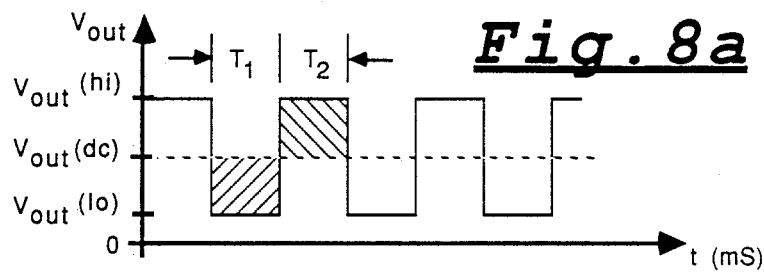
FIG. 8 is a set of plots showing voltage waveforms and timing relationships at various locations in the synchronous detector circuit of FIG. 7.

FIG. 8a illustrates the waveform of the common-mode voltage, $V_{out}$, developed across resistor R6 of the circuit of FIG. 4 and applied to the signal input of the circuit of FIG. 7. By virtue of the 180 degree phase inversion performed by the high-gain amplifier cascade of FIG. 4, $V_{out}$ assumes its low value $V_{out}(lo)$ during time period $T_1$ for which $V_{osc}$ is high, and its high value $V_{out}(hi)$ during the time period $T_2$ for which $V_{osc}$ is low. $V_{out}$ therefore oscillates about its dc bias value $V_{out}(dc) = V_o$ given by equation (2). The peak-to-peak value of the ac component of $V_{out}$ is seen to be $$|V_{out}(ac)| = \{V_{out}(hi) - V_{out}(dc)\} + \{V_{out}(dc) - V_{out}(lo)\}. \quad (21)$$

Because of the ac coupling provided by coupling capacitors C1 and C2 at the input of amplifier A1, the average excursions of $V_{out}$ above and below its dc bias value are equal. Accordingly, the two shaded areas of FIG. 8a can be equated to yield $$\{V_{out}(dc) - V_{out}(lo)\}T_1 = \{V_{out}(hi) - V_{out}(dc)\}T_2. \quad (22)$$

Substituting equation (22) into equation (21) yields $$|V_{out}(ac)| = \left[\frac{T_1 + T_2}{T_2}\right]\{V_{out}(dc) - V_{out}(lo)\}. \quad (23)$$

Figure 8B:
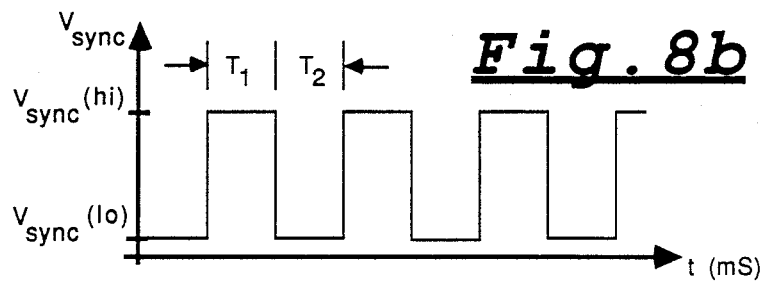

FIG. 8b illustrates the waveform of the synchronization signal, $V_{sync}$, developed at the output of operational amplifier A2 in FIG. 6 and applied to the synchronization input of the circuit of FIG. 7. This common-mode voltage signal oscillates between two voltage levels, $V_{sync}(hi)$ and $V_{sync}(lo)$, at the oscillator frequency of approximately 100 HZ. The period of oscillation $T=1/f$ is therefore approximately 10 milliseconds.

Now consider the circuit of FIG. 7 in greater detail. For simplicity, assume initially that integration capacitor C6 is zero. The negative feedback provided by resistor R17 along with the high gain of operational amplifier A3 ensures that the voltage at the inverting (−) input of A3 will be very nearly the same as the voltage at the noninverting (+) input. Because of the low-pass filtering action of bias resistor R16 and bypass capacitor C5, the voltage at the noninverting input, measured with respect to the negative power supply terminal $V_A-$, is simply the dc bias component of the input voltage $V_{out}(dc)$. Therefore, the voltage at the inverting (−) input is likewise $V_{out}(dc)$.

During time interval $T_1$, analog switch S2 is turned "on" by synchronization signal $V_{sync}(hi)$. During this interval, operational amplifier A3 serves as a simple inverting amplifier with input signal $V_{out} = V_{out}(lo)$ and output signal $V_{det} = V_{det}(hi)$. A feedback current $i_S$ flows through resistor R17, through switch S2, and through resistor R15 as shown in FIG. 7. Assuming that the "on" resistance of S2 is small compared with R15, one can write this current in terms of the voltage drop across either R15 or R17 as follows:

$$i_s = \frac{\{V_{out}(dc) - V_{out}(lo)\}}{R15} = \frac{V_{det}(hi)}{R17}. \quad (24)$$

Combining equations (23) and (24) leads to $$V_{det}(hi) = \left[\frac{T_2}{T_1 + T_2}\right]\left[\frac{R17}{R15}\right]|V_{out}(ac)|. \quad (25)$$

Figure 8C:
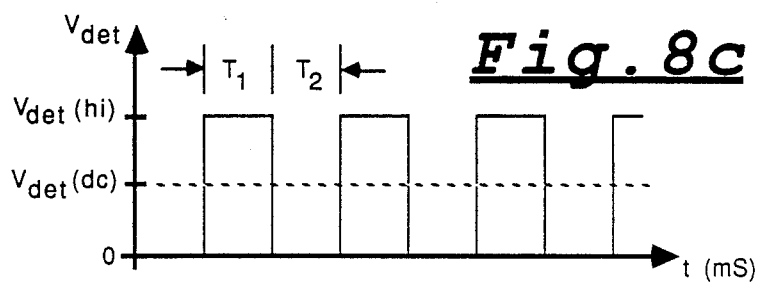

Equation (25) defines the high output level $V_{det}(hi)$ seen in FIG. 8c.

During time interval $T_2$, analog switch S2 is turned "off" by synchronization signal $V_{sync}(lo)$. Assuming that the "off" resistance of S2 is sufficiently large, one can assume that $i_S = 0$ so that no voltage drop exists across R17. Accordingly, the output of A3 assumes that same voltage, $V_{out}(dc)$, that exists at both the inverting input and the noninverting input of A3. Since the output voltage equals the voltage at the noninverting input, $V_{det}$ is zero. This zero value defines the low output level seen in FIG. 8c.

FIG. 8c illustrates the waveform of the differential-mode output signal of the suynchronous detector. One sees from the analysis detailed above that the output voltage, $V_{det}$, oscillates between the high value $V_{det}(hi)$, given by equation (25), and zero. The average, or dc value of $V_{det}$, is therefore $$V_{det}(dc) = \left[\frac{T_1}{T_1 + T_2}\right]V_{det}(hi). \quad (26)$$

Combining equations (25) and (26) to eliminate $V_{det}(hi)$ leads to $$V_{det}(dc) = \left[\frac{T_1 T_2}{(T_1 + T_2)^2}\right]\left[\frac{R17}{R15}\right]|V_{out}(ac)|. \quad (27)$$

Figure 8D:
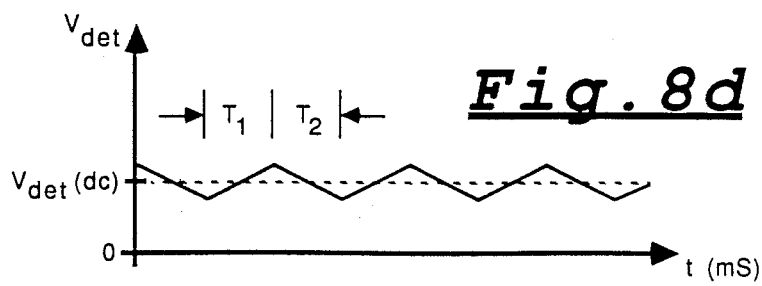

The effect of introducing the integration capacitor C6 into the circuit of FIG. 7 is illustrated in FIG. 8d. One sees that the average value of the detector output signal, $V_{det}(dc)$, is uneffected by C6. However, the integration capacitor smooths the variations in output voltage about the average value, thus reducing the ripple component of $V_{det}$. For s sufficiently large value of integration capacitor C6, $V_{det}$ is simply equal to $V_{det}(dc)$.

Equation (27) shows that the dc signal voltage at the differential output of the synchronous detector is directly proportional to the common-mode ac signal component at the output of the high-gain amplifier. The analysis above discloses that the constant of proportionality is not effected by amplifier gain or oscillator frequency. The relationship between $V_{out}(ac)$ and $V_{det}$ depend only upon the ratio of two resistance values, R15 and R17, and the oscillator symmetry ratio $(T_1/T_2)$. Furthermore, it is very insensitive to changes in the symmetry ratio when $T_1$ and $T_2$ are nearly equal. Thus, the detector circuit disclosed in FIG. 7 has nearly ideal characteristics for application to the accurate determination of battery conductance.

Moreover, the direct proportionally described by equation (27) only occurs for signal components which are at the oscillator's exact frequency and are fully correlated with the oscillator signal. All other signals, such as spurious ac hum and noise, will not contribute to the average value of $V_{det}$ and will therefore be effectively removed from the detector's output signal by the smoothing effect of the integration capacitor, C6. The circuit disclosed in FIG. 7 thus permits obtaining very accurate battery measurements in electrically "noisy" environments without requiring that the testing device be extensively shielded and therefore expensive to manufacture. Important economic benefits can consequently be gained through the use of the synchronous detector circuit disclosed in FIG. 7 in a practical battery testing device. Furthermore, in contrast to the detector circuit disclosed in U.S. Pat. No. 3,909,708 which requires "chopped" dc power, the circuit of FIG. 7 has no special power source requirements and is fully compatible with modern MSI IC technology.

Figure 9:
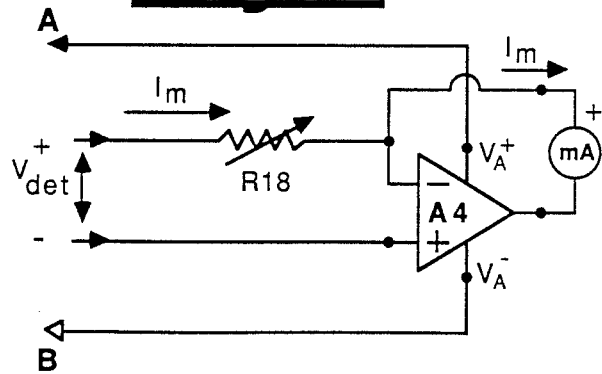
FIG. 9 is a schematic diagram of an adjustable dc amplifier and output meter circuit in accordance with present invention.

Referring next to FIG. 9, a schematic diagram of a simple adjustable dc amplifier and output metering circuit in accordance with the present invention is disclosed. The circuit comprises only operational amplifier A4, dc milliameter mA, and variable resistor R18. Just as in the case of all the other active devices, operational amplifier A4 receives its dc power from common connections to the battery at the feedback-current loop contacts A and B.

The noninverting (+) input of operational amplifier A4 is connected to the noninverting (+) input of operational amplifier A3 of FIG. 7 by the negative signal lead of $V_{det}$. Accordingly, the noninverting input of A4 is biased to the same dc level, $V_{out}(dc)$, as the noninverting input of A3. By virtue of the negative feedback introduced by signal path through milliameter mA, along with the high gain of operational amplifier A4, the inverting (−) input of amplifier A4 assumes the same voltage level as the noninverting input. The entire differential input signal, $V_{det}$, therefore appears across the input resistor R18. Since the current through the millameter, $l_m$, is the same as the current through input resistor R18, the meter current can be simply calculated by applying Ohm's law to R18. The dc meter current is therefore $$l_m = \frac{V_{det}(dc)}{R18}. \tag{28}$$

One sees that the simple circuit disclosed in FIG. 9 provides a dc current $l_m$ through the milliameter that is directly proportional to $V_{det}(dc)$. The constant of proportionally relating $l_m$ to $V_{det}(dc)$ is seen to be independent of the meter's internal resistance and is determined completely by the value of the input resistor R18.

Equations (20), (27) and (28) can now be combined to derive a ssingle relationship relating the meter current, $l_m$, to the oscillator's zener voltage, $V_z$, for the entire electronic battery testing device disclosed in the block diagram of FIG. 1. The resulting equation is written $$\frac{l_m}{V_z} = \left[\frac{T_1 T_2}{(T_1 + T_2)^2}\right]\left[\frac{R6R8R17}{(R7 + R8)R15R18}\right]G_x. \tag{29}$$

Equation (29) confirms that the dc meter current is directly proportional to the battery's internal conductance $G_x$. Moreover, the constant of proportionality is simply and precisely determined by the value of $V_z$ along with six resistances and the symmetry ratio, $(T_1/T_2)$. In practice, $(T_1/T_2)$ is very nearly one. Thus, $$\frac{l_m}{V_z} \approx \frac{1}{4}\left[\frac{R6R8R17}{(R7 + R8)R15R18}\right]G_x. \tag{30}$$

By using fixed resistances and calibrating the dc milliameter in units proportional to internal conductance, such as cold-cranking amperes or ampere-hours, the disclosed battery testing device will emulate a direct reading device of the type disclosed in U.S. Pat. No. 3,873,911. It will be apparent to one skilled in the art that in such an application, the dc amplifier and milliameter could be replaced by an linear display device, such as a digital meter, that is capable of providing a numerical display proportional to $V_{det}(dc)$.

Alternatively, by letting one of the six resistances be a variable resistance, calibrating it in battery rating units such as cold-cranking amperes or ampere-hours, and then arranging milliameter mA to designate simple qualitative conditions, the disclosed device will emulate a "pass-fail" battery testing device of the type disclosed in U.S. Pat. No. 3,909,708. It will be apparent to one skilled in the art that such an application, the milliameter could be replaced by a variety of display means, such as colored lights, that are capable of indicating the qualitative conditions.

Moreover, it can be seen from equation (30) that if $l_m$ is brought to a particular fixed value, such as the "pass-fail" point, by adjusting one of the resistances in the denominator—R15 or R18 (or R7 under the condition R7>>R8)—the appropriate value of the variable resistance will be directly proportional to the battery's conductance $G_x$. Hence, if variable resistance R18 in FIG. 9 has a linear taper, it can be linearly calibrated in conventional battery rating units—such as ampere-hours or cold cranking amperes—that that are proportional to the conductance of a battery capable of delivering its full-rated power. Such linearity of the rating scale improves precision and is a great convenience for the operator.

Figure 10:
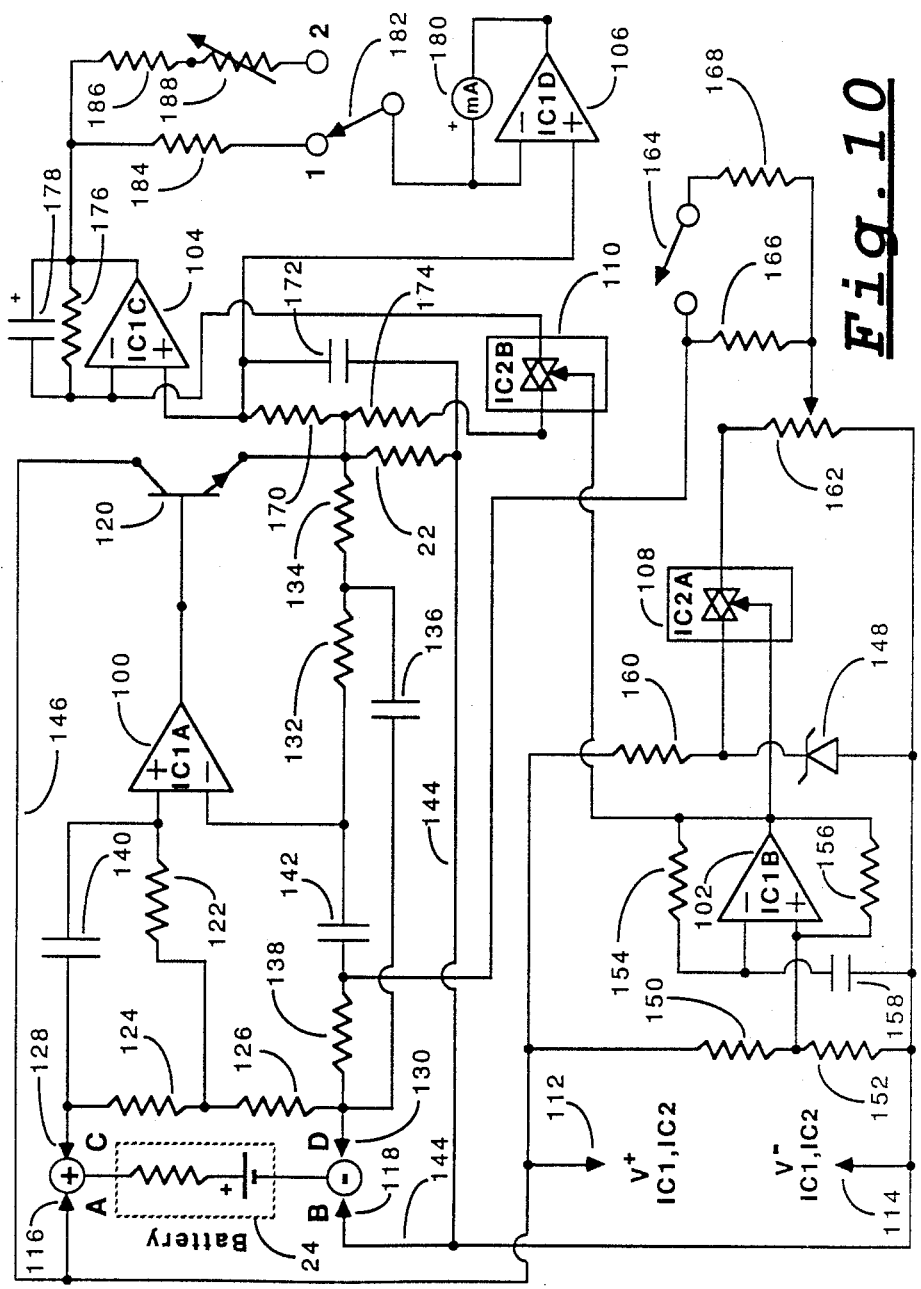
FIG. 10 is a complete schematic diagram of an improved electronic battery testing device for testing 12-volt automative batteries in accordance with the present invention.

FIG. 10 discloses a complete schematic diagram of an improved device for testing 12-volt automotive batteries in accordance with the present invention. Operational amplifiers 100, 102, 104, and 106 comprises four elements of an MSI quad operational amplifier integrated circuit, IC1. Bilateral analog switch 108 and 110 comprise two elements of a CMOS biloateral switch integrated circuit, IC2. Both IC1 and IC2 are powered by means of common connections, 112 and 114, to the battery undergoing test 24 through current-feedback loop contacts 116 and 118, respectively.

High-gain amplifier cascade 12 of FIG. 1 comprises operational amplifier 100 and npn transistor 120 connected as an emitter follower. Resistor 122 conducts a dc bias voltage to the noninverting (+) input of operational amplifier 100 from voltage divider resistors 124 and 126 which are connected to battery 24 through voltage-sensing contacts 128 and 130. The output voltage of high-gain amplifier cascade 12 is established across external-path feedback resistor 22. An internal feedback path comprising resistors 132 and 134 conducts the dc voltage at the common connection between the emitter of npn transistor 120 and resistor 22 to the inverting (−) input of operational amplifier 100. Resistors 132 and 134 along with capacitor 136 comprise low-pass filter 18 of FIG. 1.

The ac signal voltage developed across battery 24 is sensed at voltage-sensed contacts 128 and 130 and added in series to an input signal voltage component established across viewing resistor 138. The resultant composite ac signal voltage is applied to the differential input of operational amplifier 100 by a capacitive coupling network comprising capacitors 140 and 142. A feedback current that is proportional to the voltage established across resistor 22 passes through battery 24 by means of external feedback path conductors 144 and 146 along with current-feedback loop battery contacts 116 and 118.

The ac input signal voltage established across viewing resistor 138 is generated by a precisely-leveled oscillator circuit comprising operational amplifier 102, analong switch 108, and zener diode 148. Operational amplifier 102 along with resistors 150, 152, 154, 156, and capacitor 158 comprise a conventional astable multivibrator circuit used to generate a square-wave synchronizing signal. Resistor 160 supplied bias current to zener diode 148. The synchronizing output of operational amplifier 102 connects to the control input of analog switch 108. The two signal contacts of analog switch 108 interconnect the output of zener diode 148 with the input of potentiometer 162. Potentiometer 162 provides means to initially adjust the level of the voltage signal outputted by analog switch 108.

SPST switch 164 provides for the selection of either of two levels of signal voltage and serves as a temperature compensation adjustment. This temperature compensation adjustment corrects for battery temperature and provides means for obtaining increased accuracy when measuring batteries at other than room temperature. With SPST switch 164 in the open position, a current proportional to the output voltage of potentiometer 162 passes through injection resistor 166 and is injected into viewing resistor 138 thereby developing a signal voltage across viewing resistor 138. Closure of switch 164 places resistor 168 in parallel with resistor 166 thereby increasing the level of signal voltage developed across viewing resistor 138; as would be appropriate to measuring a battery that was at a reduced temperature. It will be apparent to one of ordinary skill in the art that several alternative temperature compensation methods are available. For example, the temperature compensation adjustment could provide more than two signal values; or it could be implemented with a continuous, rather than a discrete, resistance adjustment. In addition, a temperature compensation adjustment could be implemented by varying resistances at other locations in the battery tester circuit as can be easily recognized from an examination of equation (30) derived herein above.

Analong switch 110 along with operational amplifier 104, which is connected as an integrator, comprise synchronous detector circuit 40 of FIG. 1. Resistor 170 and bypass capacitor 172 comprise a low-pass filter which biases the noninverting inputs of operational amplifiers 104 and 106 to the voltage level of the dc bias component developed across resistor 22. A signal current derived from the total voltage at the common connection between resistor 22 and transistor 120 passes through resistor 174 and analog switch 110 to the inverting input of operational amplifier 104. This signal current is periodically interrupted at the oscillator frequency by virtue of the control input of analog switch 110 being connected to the synchronizing output of operational amplifier 102. Resistor 176 provides negative dc feedback to operational amplifier 104. Integration capacitor 178 serves to smooth the detected voltage signal outputted by operational amplifier 104.

A current derived from the detected signal voltage at the output of operational amplifier 104 passes through milliameter 180 to the output of operational amplifier 106 by way of one of the two paths selected by SPDT switch 182. With switch 180 in position 1, the meter current passes through fixed resistor 184. Under these conditions, the disclosed invention emulates a direct reading battery testing device having an output indication that is proportional to the dynamic conductance of battery 24. With switch 182 in position 2, the meter current passes through fixed resistor 186 and variable resistor 188. Under these conditions the disclosed invention emulates a "pass-fail" battery testing device having an adjustable battery rating scale that is linearly related to the setting of variable resistance 188 and a rating offset that is determined by the value of fixed resistor 186. As will be apparent to one of ordinary skill in the art, several alternative linear battery rating adjustment methods can be implemented. As discussed herein above, a linear relationship will exist between battery rating and the adjustment resistance if any one of the three resistances in the denominator of equation (30) is chosen to be the adjustment. Thus, one could choose to select and vary resistor 174(R15) instead of resistor 188(R18). Alternatively, if resistor 168 was not employed for temperature compensation, one could choose to vary resistor 166(R7) under the condition that the injection resistor 166 is much larger than the viewing resistor 138(R8).

A list of component types and values for the improved electronic battery testing device disclosed in FIG. 10 follows:

| REFERENCE NUMBER | COMPONENT |
|---|---|
| Semiconductor Devices | |
| 100,102,104,106 | IC1 - LM324N |
| 108,110 | IC2 - CD4066B |
| 120 | TIP31C Power Transistor |
| 148 | 1N5231B Zener Diode |
| Resistors - Ohms (¼-W unless specified) | |
| 22 | 22 - 5 Watts |
| 138,186 | 100 |
| 184 | 470 |
| 188 | 500 Variable |
| 124,126,160 | 1K |
| 162 | 5K Trimpot |
| 122,176 | 47K |
| 170,174 | 100K |
| 154 | 150K |
| 156 | 270K |
| 166 | 330K |
| 132,134,150,152 | 1 Meg |
| 168 | 1.5 Meg |
| Capacitors - Mfd | |
| 158 | 0.022 |
| 136,140,142,172 | 0.47 |
| 178 | 1.0 |
| Meter | |
| 180 | 1 mA dc milliameter |

Although a specific mode for carrying out the present invention has been herein described, it is to be understood that modification and variation may be made without departing from what is regarded to be the subject matter of the invention. For example, visual display means have been specifically disclosed herein above. However, the output of the disclosed electronic battery testing circuit could alternatively be monitored by a voltage sensing device that responds to a drop in output signal level by sounding an audible alarm, causing a visible display, or by switching particular equipment to an alternative power source. Moreover, the circuit output could be monitored by a computer specifically programmed to respond appropriately to the level of the output signal. The range of potential computer responses would be virtually unlimited and is restricted only by the imagination of the computer programmer. These, and other variations are believed to be well within the scope of the invention and are intended to be covered by the appended claims.

What is claimed is:

1. An electronic device for testing a direct current energy source comprising:
   a. high-gain amplifier means receiving dc power through amplifier dc power terminals;
   b. internal voltage-feedback means, including low-pass filter means, interconnecting the output and the input of said high-gain amplifier means;
   c. external current-feedback means, including feedback resistor means, conducting a current from the output of said high-gain amplifier means through said direct current energy source.
   d. oscillator means producing a periodic oscillator signal, siad oscillator means receiving dc power through oscillator dc power terminals connectd directly in parallel with said amplifier dc power terminals;
   e. voltage summing and coupling means adding voltage derived from said periodic oscillator signal to the voltage across said direct current energy source, and capacitively coupling the sum voltage to the input of said high-gain amplifier means;

f. detector means producing a dc output signal in response to the ac voltage component across said feedback resistor means; and g. display means responsive to the level of said dc output signal.

2. An electronic device as in claim 1 wherein said display means displays numbers proportional to said dc output signal.

3. An electronic device as in claim 2 wherein said numbers are cold-cranking ampere numbers.

4. An electronic device as in claim 1 including temperature compensation means for adjusting the level of said dc output signal in accordance with the temperature of said direct current energy source.

5. An electronic device as in claim 1 including rating adjustment means for changing the level of said dc output signal in accordance with the electrical range of said direct current energy source, and said display means displays qualitative conditions of said direct current energy source.

6. An electronic device as in claim 5 wherein said rating adjustment means comprises a variable resistance, and said electrical rating is described in numbers that are linearly related to the resistance value of said variable resistance.

7. An electronic device as in claim 6 wherein said electrical rating is described in cold-cranking ampere numbers.

8. An electronic device as in claim 6 wherein said electrical rating is described in ampere-hour numbers.

9. An electronic device for testing a direct current energy source comprising:
  a. high-gain amplifier means;
  b. internal voltage-feedback means, including low-pass filter means, interconnecting the output and the input of said high-gain amplifier means;
  c. external current-feedback means, including feedback resistor means, conducting a current from the output of said high-gain amplifier means through said direct current energy source;
  d. oscillator means producing a periodic oscillator signal;
  e. voltage summing and coupling means adding a voltage derived from said periodic oscillator signal to the voltage across direct current energy source, and capacitively coupling the sum voltage to the input of said high-gain amplifier means;
  f. detector means, including an analog switch means and a continuously-powered operational amplifier means, said analog switch means conducting a signal from the output of said high-gain amplifier means to the input of said continuously-powered operational amplifier means while being periodically turned on and off in synchronism with said periodic oscillator signal; and,
  g. measuring and displaying means deriving a display signal from the output of said continuously-powered operational amplifier means and providing a visual display in response to the level of said display signal.

10. An electronic device as in claim 9 wherein said measuring and displaying means displays numbers proportional to said display signal.

11. An electronic device as in claim 10 wherein said numbers are cold-cranking ampere numbers.

12. An electronic device as in claim 9 including temperature compensation menas for adjusting the level of said display signal in accordance with the temperature of said direct current energy source.

13. An electronic device as in claim 9 including rating adjustment means for changing the level of said display signal in accordance with the electrical rating of said direct current energy source, and said measuring and displaying means displays qualitative conditions of said direct current energy source.

14. An electronic device as in claim 13 wherein said rating adjustment means comprises a variable resistance, and said electrical rating is described in numbers that are linearly related to the resistance value of said variable resistance.

15. An electronic device as in claim 14 wherein said electrical rating is described in cold-cranking ampere numbers.

16. An electronic device as in claim 14 wherein said electrical rating is described in ampere-hour numbers.

17. An electronic device for testing a direct current energy source comprising:
  a. high-gain amplifier means;
  b. internal voltage-feedback means, including low-pass filter means, interconnecting the output and the input of said high-gain amplifier means;
  c. external current-feedback means, including feedback resistor means, conducting a current from the output of said high-gain amplifier means through said direct current energy source.
  d. oscillator means including analog switch means, constant voltage means, and synchronizing means, said analog switch means conducting a signal from said constant voltage means to the output of said oscillator means while being switched on and off at a periodic rate by said synchronizing means, thereby producing a periodic oscillator signal at said output of said oscillator means;
  e. voltage summing and coupling means adding a voltage derived from said periodic oscillator signal to the voltage across said direct current energy source and capacitively coupling the sum voltage to the input of said high-gain amplifier means;
  f. detector means producing a dc output signal in response to the ac voltage component across said feedback resistor means; and,
  g. display means responsive to the level of said dc output signal.

18. An electronic device as in claim 17 wherein said display means displays numbers proportional to said dc output signal.

19. An electronic device as in claim 18 wherein said numbers are cold-cranking ampere numbers.

20. An electronic device as in claim 17 including temperature compensation means for adjusting said dc output signal in accordance with the temperature of said direct current energy source.

21. An electronic device as in claim 17 including rating adjustment means for setting the level of said dc output signal in accordance with the electrical rating of said direct current energy source, and said display means denotes qualitative conditions of said direct current energy source.

22. An electronic device as in claim 21 wherein said rating adjustment means comprises a variable resistance, and said electrical rating is described in numbers that are linearly related to the resistance value of said variable resistance.

23. An electronic device as in claim 22 wherein said electrical rating is described in cold-cranking ampere numbers.

24. An electronic device as in claim 22 wherein said electrical rating is described in ampere-hour numbers.

25. An electronic device for testing a direct current energy source comprising:
   a. high-gain amplifier means receiving dc power from power-supplying contacts contacting the direct current energy source;
   b. internal voltage-feedback means, including low-pass filter means, interconnecting the output and the input of said high-gain amplifier means;
   c. external current-feedback means, including feedback resistor means, conducting a current from the output of said high-gain amplifier means through said direct current energy source by means of said power-supplying contacts;
   d. oscillator means receiving dc power from said power-supplying contacts and producing a periodic oscillator signal current,
   e. voltage summing and coupling means, including a pair of voltage-sensing contacts contacting said direct current energy source, and viewing resistor means, said summing and coupling means adding the voltage across said viewing resistor means to the voltage across said voltage-sensing contacts and capacitively coupling the summed voltage to the input of said high-gain amplifier means;
   f. voltage injection means passing said periodic oscillator signal current from the output of said oscillator means through said viewing resistor means thereby producing a periodic signal voltage thereacross;
   g. dectector meand converting the ac voltage component across said feedback resistor means to a dc output signal; and
   h. display means responsive to the level of said dc output signal.

26. An electronic device as in claim 25 wherein said display means displays numbers proportional to said dc output signal.

27. An electronic device as in claim 26 wherein said numbers are cold-cranking ampere numbers.

28. An electronic device as in claim 25 including temperature compensation means for adjusting said dc output signal in accordance with the temperature of said direct current energy source.

29. An electronic device as in claim 25 including rating adjustment means for changing the level of said dc output signal in accordance with the electrical rating of said direct current energy source, and said display means displays qualitative conditions of said direct current energy source.

30. An electronic device as in claim 29 wherein said rating adjustment means comprises a variable resistance, and said electrical rating is described in numbers that are linearly related to the resistance value of said variable resistance.

31. An electronic device as in claim 30 wherein said electrical rating is described in cold-cranking ampere numbers.

32. An electronic device as in claim 30 wherein said electrical rating is described in ampere-hour numbers.

33. A system for assessing the ability of a direct current supply, having an internal resistance, to deliver power to a load including:
   a time-varying voltage source having a pair of dc power-receiving terminals;
   a time-varying current generating means having a pair of dc power-receiving terminals connected in parallel with the dc power-receiving terminals of the time-varying voltage source, the current generating means operably connected to the supply and producing an output directly proportional to the time-varying voltage source and inversely proportional to the internal resistance;
   means for sensing the current generating means output and producing an output signal responsive thereto; and
   means for responding to the level of the output signal.

34. The system as set forth in claim 33 wherein the means for responding includes a computer.

35. The system as set forth in claim 33 wherein the means for responding provides a numerical display with numbers linearly related to the output signal level.

36. The system as set forth in claim 33 including means for adjusting the output signal level in accordance with a selected rating, wherein the means for responding identifies qualitative conditions of the supply.

37. A system for assessing the ability of a direct current supply, having an internal resistance, to deliver power to a load comprising:
   a current-feedback loop including current-feedback contacts operably contacting the supply;
   a voltage-sensing loop including a viewing resistor and voltage-sensing contacts operably contacting the supply;
   a time-varying voltage source receiving dc power from the current-feedback contacts and injecting a signal current through the viewing resistor in the voltage-sensing loop;
   a time-varying current generating means receiving dc power from the current-feedback contacts and generating a current proportional to the signal voltage across the viewing resistor and inversely proportional to the internal resistance of the supply;
   means for sensing the current generating means output and producing an output signal responsive thereto; and
   means for responding to the level of the output signal.

38. The system as set forth in claim 37 wherein the means for responding includes a computer.

39. The system as set forth in claim 37 wherein the means for responding provides a numerical display with numbers linearly related to the output signal level.

40. The system as set forth in claim 37 including means for adjusting the output signal level in accordance with a selected rating, wherein the means for responding identifies qualitative conditions of the supply.

* * * * *

UNITED STATES PATENT AND TRADEMARK OFFICE
CERTIFICATE OF CORRECTION

PATENT NO. : 4,816,768
DATED : March 28, 1989
INVENTOR(S) : Keith S. Champlin

It is certified that error appears in the above-identified patent and that said Letters Patent is hereby corrected as shown below:

Column 1, line 6, delete the word "stoage" and substitute therefor --storage--.

Column 1, line 42, delete the word "presecribed" and substitute therefor --prescribed--.

Column 2, line 19, delete the word "accurate,1" and substitute therefor --accurate,--.

Column 2, line 45, delete the word "employes" and substitute therefor --employs--.

Column 3, line 1, delete the word "version" and substitute therefor --versions--.

Column 3, line 10, delete the word "natures," and substitute therefor --natures, could currently be realized by exploiting this newer, more advanced,--.

UNITED STATES PATENT AND TRADEMARK OFFICE
CERTIFICATE OF CORRECTION

PATENT NO. : 4,816,768
DATED : March 28, 1989
INVENTOR(S) : Keith S. Champlin It is certified that error appears in the above-identified patent and that said Letters Patent is hereby corrected as shown below:

Column 3, line 33, delete the word "supress" and substitute therefor --suppress--.

Column 3, line 34, delete the word "aspurious" and substitute therefor --spurious--.

Column 4, line 6, delete the word "accuracy." and substitute therefor --employing a--.

Column 5, line 1, delete the word "automative" and substitute therefor --automotive--.

Column 5, line 10, delete the word "cascase" and substitute therefor --cascade--.

Column 5, line 23, delete the word "acrosss" and substitute therefor --across--.

Column 5, line 47, delete the word "correclated" and substitute therefor --correlated--.

UNITED STATES PATENT AND TRADEMARK OFFICE
CERTIFICATE OF CORRECTION

PATENT NO. : 4,816,768
DATED : March 28, 1989
INVENTOR(S) : Keith S. Champlin

It is certified that error appears in the above-identified patent and that said Letters Patent is hereby corrected as shown below:

Column 5, line 48, delete the word "oscillaot" and substitute therefor --oscillator--.

Column 5, line 63, delete the word "millameter" and substitute therefor --milliameter--.

Column 6, line 22, delete the number "1" and substitute therefor --2--.

Column 6, line 43, delete the word "noniverting" and substitute therefor --noninverting--.

Column 7, line 38, delete the words "The input voltage-sensing loop comprises battery resistance $R_x$ along with ac signal voltage $V_{in}$, capacitors C1 and C2."

Column 8, line 17, delete the word "face" and substitute therefor --fact--.

UNITED STATES PATENT AND TRADEMARK OFFICE
CERTIFICATE OF CORRECTION

PATENT NO. : 4,816,768

DATED : March 28, 1989

INVENTOR(S) : Keith S. Champlin

It is certified that error appears in the above-identified patent and that said Letters Patent is hereby corrected as shown below:

Column 8, line 22, delete the word "implemented" and substitute therefor --to the battery may simply comprise temporary connections implemented--.

Column 8, line 30, delete the words "supurious resistnace" and substitute therefor --spurious resistance--.

Column 8, line 50, delete the word "voltag-sensing" and substitute therefor --voltage-sensing--.

Column 9, line 2, delete the word "battery" and substitute therefor --battery undergoing tests through power terminal $V_A+$, connected to battery--.

Column 9, line 28, delete the words "the avoid" and subtitute therefor --to avoid--.

UNITED STATES PATENT AND TRADEMARK OFFICE
CERTIFICATE OF CORRECTION

PATENT NO. : 4,816,768

DATED : March 28, 1989

INVENTOR(S) : Keith S. Champlin

It is certified that error appears in the above-identified patent and that said Letters Patent is hereby corrected as shown below:

Column 9, line 29, delete the word "voltage-snesing" and substitute therefor --voltage-sensing--.

Column 9, line 47, delete the word "powereed" and substitute therefor --powered--.

Column 11, line 11, delete the word "eariler" and substitute therefor --earlier--.

Column 11, line 59, delete the word "taht" and substitute therefor --that--.

Column 12, line 20, delete the word "employes" and substitute therefor --employs--.

Column 13, line 17, delete the word "that" and substitute therefor --than--.

UNITED STATES PATENT AND TRADEMARK OFFICE
CERTIFICATE OF CORRECTION

PATENT NO. : 4,816,768

DATED : March 28, 1989

INVENTOR(S) : Keith S. Champlin

It is certified that error appears in the above-identified patent and that said Letters Patent is hereby corrected as shown below:

Column 14, line 30, the comma should be on the previous line.

Column 14, line 31, delete the word "batter" and substitute therefor --battery--.

Column 15, line 56, delete the word "suynchronous" and substitute therefor --synchronous--.

Column 16, line 12, delete the word "s" and substitute therefor --a--.

Column 17, line 13, delete the word "proportionally" and substitute therefor --proportionality--.

Column 17, line 18, delete the word "ssingle" and substitute therefor --single--.

UNITED STATES PATENT AND TRADEMARK OFFICE
CERTIFICATE OF CORRECTION

PATENT NO. : 4,816,768

DATED : March 28, 1989

INVENTOR(S) : Keith S. Champlin

It is certified that error appears in the above-identified patent and that said Letters Patent is hereby corrected as shown below:

Column 17, line 46, delete the word "an" and substitute therefor --any--.

Column 17, line 56, delete the word "that" and substitute therefor --that in--.

Column 18, line 11, delete the word "switch" and substitute therefor --switches--.

Column 18, line 12, delete the word "biloateral" and substitute therefor --bilateral--.

Column 18, line 34, delete the word "voltage-sensed" and substitute therefor --voltage-sensing--.

Column 18, line 52, delete the word "supplied" and substitute therefor --supplies--.

UNITED STATES PATENT AND TRADEMARK OFFICE
CERTIFICATE OF CORRECTION

PATENT NO. : 4,816,768
DATED : March 28, 1989
INVENTOR(S) : Keith S. Champlin

It is certified that error appears in the above-identified patent and that said Letters Patent is hereby corrected as shown below:

Column 19, line 18, delete the word "Analong"
    and substitute therefor --Analog--.

Column 20, line 60, delete the word "siad"
    and substitute therefor --said--.

Column 20, line 61, delete the word "connectd"
    and substitute therefor --connected--.

Column 20, line 64, delete the word "adding"
    and substitute therefor --adding a--.

Column 21, line 68, delete the word "menas"
    and substitute therefor --means--.

Column 23, line 35, delete the words "dectector
    meand" and substitute therefor --detector
    means--.

Signed and Sealed this

Twenty-seventh Day of March, 1990

*Attest:*

JEFFREY M. SAMUELS

*Attesting Officer*    *Acting Commissioner of Patents and Trademarks*